United States Patent [19]
Cartier

[11] Patent Number: 5,881,106
[45] Date of Patent: Mar. 9, 1999

[54] SIGNAL PROCESSING CIRCUIT TO IMPLEMENT A VITERBI ALGORITHM

[75] Inventor: Michel Cartier, Grenoble, France

[73] Assignee: SGS-Thomson Microelectronics S.A., Saint Genis, France

[21] Appl. No.: 521,519

[22] Filed: Aug. 30, 1995

[30] Foreign Application Priority Data

Sep. 5, 1994 [FR] France .................................. 94 10620

[51] Int. Cl.⁶ .................................................. H03M 13/12
[52] U.S. Cl. ........................ 375/262; 375/341; 371/43.7; 371/43.8; 341/94; 341/107
[58] Field of Search ..................... 375/262, 340, 375/341; 371/43, 41, 43.6–43.8; 341/107, 94; 364/133, 769

[56] References Cited

U.S. PATENT DOCUMENTS

| | | | |
|---|---|---|---|
| 5,181,209 | 1/1993 | Hagenauer et al. ....................... | 371/43 |
| 5,220,570 | 6/1993 | Lou et al. ................................. | 371/43 |
| 5,412,669 | 5/1995 | Foland, Jr. ............................... | 371/43 |
| 5,432,804 | 7/1995 | Diamondstein et al. ................. | 371/43 |

FOREIGN PATENT DOCUMENTS

| | | | |
|---|---|---|---|
| A-0 488 809 | 10/1991 | European Pat. Off. ....... | H03M 13/12 |
| WO-A-93 19418 | 9/1993 | WIPO .............................. | G06F 11/10 |

OTHER PUBLICATIONS

French Search Report from French Patent Application 94 10620, filed Sep. 5, 1994.
Globecom '90: IEEE Global Telecommunications Conference and Exhibition, 'Communications: Connecting the Future' (CAT. No. 90CH2827–4), San Diego, CA, USA, Dec. 2–5, 1990, New York, USA. IEEE USA, pp. 1333–1337 vol. 2, Lou H., et al., "A Programmable Parallel Processor Architecture For Viterbi Detection".
Patent Abstracts of Japan, vo. 018, No. 608 (e–1633), Nov. 18, 1994 & JP–A–06 232923 (Sony Corp).

*Primary Examiner*—Amanda Le
*Attorney, Agent, or Firm*—Wolf, Greenfield & Sacks, P.C.

[57] ABSTRACT

To carry out the processing operations relating to the implementation of a Viterbi algorithm, an integrated circuit comprising a processor and a coprocessor is made. The coprocessor is constructed so as to carry out operations of accumulation, comparison and selection in order to limit or reduce the work of a processor that would have to carry out these operations. By judiciously choosing the structure of the coprocessor, it is possible to make this co-processor sufficiently programmable so that it is suited to various situations of implementation of the Viterbi algorithm.

15 Claims, 8 Drawing Sheets

SIGNAL PROCESSING CIRCUIT TO IMPLEMENT A VITERBI ALGORITHM

BACKGROUND OF THE INVENTION

1. Field of the Invention

The present invention relates generally to signal processing circuits. More particularly, the present invention is a signal processing circuit to implement a Viterbi algorithm. An algorithm of this type is used especially for the correction of errors in the decoding of signals encoded with convolutive codes as well as in the decoding of lattice-encoded modulated signals. It is also used for channel equalization and voice recognition. The invention relates particularly to the first three of the above-mentioned applications although it also relates to the fourth one.

2. Discussion of the Related Art

Figure 1:
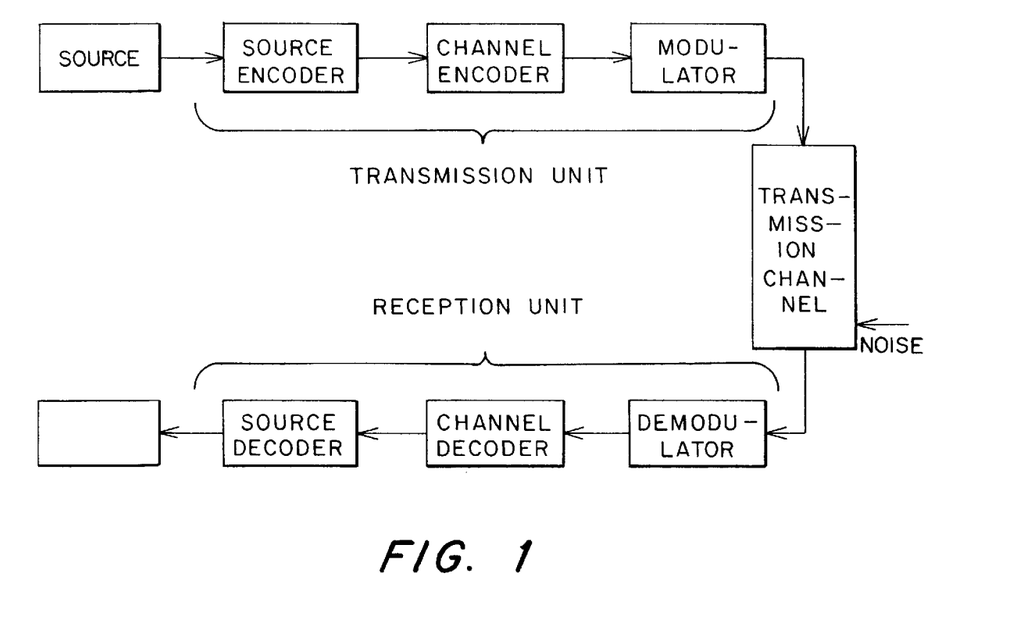
FIG. 1 illustrates a digital communication system.

For purposes of explanation only, the invention shall thus be explained within the context of a system for the decoding of signals transmitted by a transmission system. The signals in question are digital signals. A digital communications system shown in FIG. 1 has a digital signal source linked with a transmission unit. The transmission unit is coupled to a transmission channel. The transmission channel is also coupled to a reception unit that lets through signals that can be used by a user. The source produces a message consisting of a flow of bits. In order that the quantity of information received by the user may be as accurate as possible, the first operation performed by the transmission unit is an operation of source encoding or compression aimed at reducing the quantity of information to be transmitted. Furthermore, the transmission unit uses a channel encoder to convert the message to be transmitted into a message that is less vulnerable to disturbances in the channel. This is done by means of an operation of error correction encoding that adds redundancy to the method. The third operation performed by the transmission unit is the modulation by which the transmitted signal is adjusted to the characteristics of the channel. This operation makes use of frequency shifts. The transmission channel is a physical medium that enables communication from one point to another. The channel may be a wired connection or an RF transmission channel.

The reception unit carries out reciprocal operations. It notably has a demodulator that may carry out a channel equalizing operation and it has the function of purifying the bits received. A Viterbi algorithm may be used to carry out an equalization such as this. A channel decoder connected to the demodulator detects and corrects the bit errors resulting from transmission by the transmission channel. It is notably more complicated than the channel encoder. Finally, a source decoder connected to the channel decoder reproduces the original signal. The source decoder is generally less complicated than the source encoder.

It is known that there are four types of modulation:

amplitude modulation (AM);

frequency shift keying (FSK);

phase shift keying (PSK); and quadrature amplitude modulation (QAM).

In phase shift keying, the phase of the carrier is transmitted with shifts, for example in phase or in phase opposition depending on whether a 1 or a 0 is to be transmitted. This corresponds to binary phase-shift keying. However, there also is a known way of using the smaller phase shifts of the carrier. Thus, in quadrature phase-shift keying (QPSK), it is possible to transmit two bits with a single phase signal. In practice, problems of technical construction limit the phase shifts to one 8 PSK type modulation enabling the transmission of three bits per second and by Hertz.

For higher spectral efficiency, the modulation used is the amplitude and phase modulation, also known as QAM (quadrature amplitude modulation), is used, notably the so-called 16 QAM modulation that enables the sending of up to four bits per second by RF means. In the field of high definition television, 1024 QAM type modulation is known. Such types of modulation make it possible notably to have bit rates of 30 Mbits per second in an 8 MHZ passband.

There are three types of transmission channels. When the transmission unit has a direct and unique link with the transmission unit, the channel is said to be a Gaussian channel. It is known that such a channel adds Gaussian noise to the modulated signal transmitted. By contrast, when the reception unit is connected to the transmission unit by a non-unique channel, producing notably echoes by signal reflection, this channel is called a Rice channel. Finally, when there is no direct link, the channel is called a Rayleigh channel. These last-named two channels are fading channels and must be considered notably for communication with moving bodies, especially in GSM type telephone systems.

Another defect shown by transmission channels is inter-symbol interference. The lower the period of the transmitted signal as compared with the pulse response of the channel, the more perceptible is this defect of inter-symbol interference. However, depending on the knowledge of this pulse response, it is possible to make a subtraction, from the signals received, of the contribution due to previous signals. This procedure is also called equalization. A procedure such as this may be implemented in different and varyingly complex ways. One of the most appropriate ways consists in implementing the Viterbi algorithm.

SUMMARY OF THE INVENTION

The invention therefore relates to a signal processing circuit comprising a processor, a data memory to store data received and data processed by the circuit, a program memory to store instructions of a processing program, this processing program comprising means to implement a Viterbi algorithm, wherein said circuit comprises a coprocessor in relation with these memories to carry out a processing operation of accumulation comparison and selection corresponding to this algorithm.

BRIEF DESCRIPTION OF THE DRAWINGS

The invention will be understood more clearly from the description here below and the accompanying figures. These are given purely by way of an example and in no way restrict the scope of the invention. Of these figures.

DETAILED DESCRIPTION

The basic aspect of error correction is redundancy. Without redundancy, each bit of the message is essential to the understanding the message. The aim of redundancy is not to allow the appearance of errors to jeopardize the meaning of a message. Redundancy is introduced by an encoding operation performed on the message. There are two types of encoding: block encoding and convolutive encoding. Block encoding consists notably of the creation, with K bits to be transmitted being known, of N–K redundancy bits. The transmitted block then has a length of N bits. Usually, the N–K bits are the remainder of a polynomial division, of the K bits to be transmitted by a reference polynomial. A code rate R is defined as the ratio between the number of information bits to be transmitted, K, and the number of bits transmitted, N. R then equals K/N.

The K bit messages may have $2^K$ different values. When K-bit word is encoded on N bits, a certain number of prohibited words is obtained: this number is equal to $2^N-2^K$. When a prohibited word is received instead of a real expected word, a divergence between this prohibited word and the possible true words is measured. The word chosen as a true word is the closest true word. Consequently, a minimum encoding distance is defined. This is the minimum number of different bits required to go from one possible word to another. The best known systems of block encoding are parity encoding, Hamming encoding, Golay encoding, so-called BCH encoding, and Reed-Solomon encoding. The last-named encoding system is a perfect encoding system in that as it uses 2t redundancy bits to correct t errors. The block encoding operations are used in spatial transmission, transmission by cables, high-definition television and the storage of data in dynamic memories and optical disks. There is no standard. Each use requires its own code.

Figure 2:
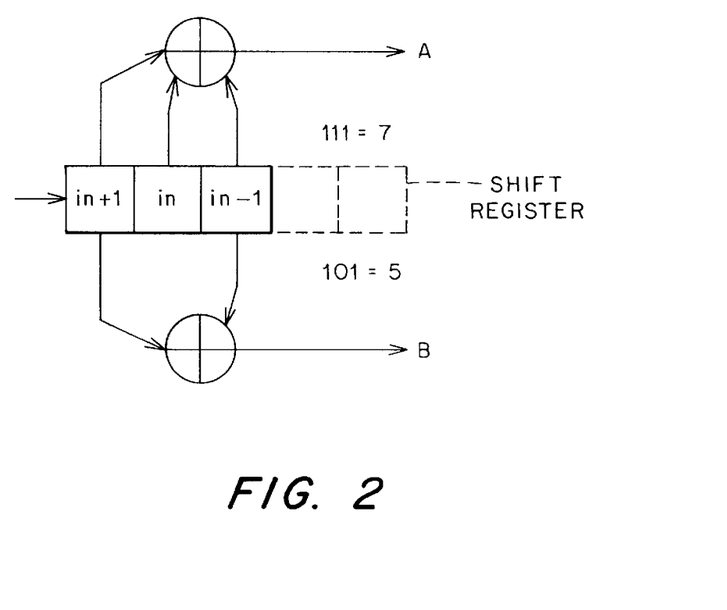
FIG. 2 illustrates a circuit for encoding convolutive codes.

The convolutive codes consist also of the production, from K bits to be transmitted, of N encoded bits (N>K) called symbols. The particular feature of these convolutive encoding operations is the fact that the N–K bits added and the K bits transmitted all depend indirectly on the K bits to be transmitted. The principle of the encoding of these convolutive codes is shown in FIG. 2. In this figure, K=1 and N=2. The rate of ½ shall be considered throughout the rest of this application but shall not be restrictive. An encoding device of this type has a shift register with m+1 stages and a logic combination circuit, herein two Exclusive-OR circuits, to produce the symbols transmitted, herein A, B. A major difference between the block encoding operations and the convolutive encoding operations lies in the fact that the K information bits are therefore transmitted not as such but in a form where they are convoluted with preceding bits. In the convolutive encoding operations, certain transitions in the transmitted symbols are prohibited. Decoding algorithms take account of this to retrieve the reality of a message to be transmitted. Contrary to block encoding, convolutive encoding operations are well suited to continuous transmission. They give an approximate correction.

The error correction systems always add redundancy. There are two ways of transmitting this redundancy. Either the passband needed to transmit the information elements is increased or the type of modulation is changed so as to go from a modulation with a low spectral efficiency to a modulation with higher spectral efficiency. The latter method is called encoded modulation.

Thus, the insertion of a convolutive code with a rate of ½ into a binary phase-shift keying system doubles the passband. In this case, the use of a quadrature phase-shift keying system again leads to the same passband as with the uncoded system.

However, as and when the constellation of a QAM type modulation contains a greater number of dots, these dots become ever closer to one another and their immunity to noise is reduced. Fortunately, the possibilities of error correction compensate for more than this loss. When the encoding used is a block encoding system, the term used will be block encoded modulation. When the code used is a convolutive code, the term used will be a lattice-encoded modulation. In the latter case, the Viterbi algorithm is used in the decoding. The main application is the so-called V32 standard: a 16 QAM modulation has been replaced by a 32 QAM modulation with m=4, R=4/5.

Hereinafter in this explanation, we shall show the principle of the Viterbi algorithm as well as the modifications of this algorithm for its use to decode lattice-encoded modulated information or to carry out a channel equalization. All the following explanations must be understood, without losing the character of their general application, on the basis of the simple example given with reference to FIG. 2. In this example, the shift register has three compartments or slots, m=2, whereas in practice it has five or another number of these slots.

Figure 3:
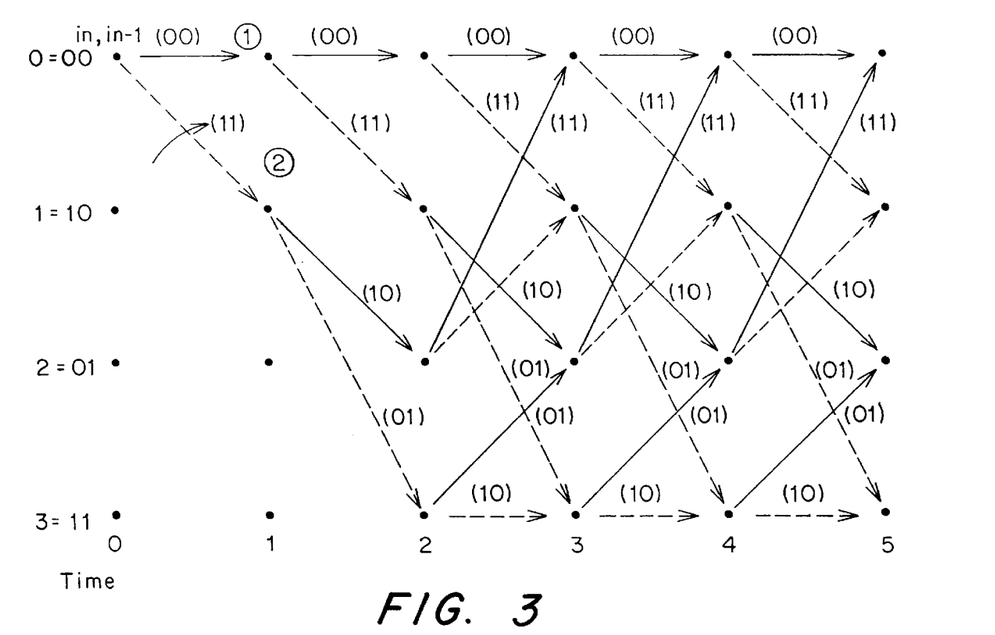
FIG. 3 illustrates the transitions that occur in the shift register of FIG. 2.

FIG. 3 considers the transitions that occur in the shift register. They are presented as a function of the possible values of the doublets ("in", in–1) as and when the bits are injected and therefore as and when progress occurs in time.

The circuit of FIG. 2 has a three-stage shift register. The outputs of each of these stages are connected to the inputs of a first Exclusive-OR gate that delivers a signal A. The outputs of the first and third stage are furthermore connected to the inputs of another Exclusive-OR gate that delivers a signal B. The signals A and B are transmitted by the channel. Thus, for one injected message bit, there are two symbol bits A and B transmitted. It will be recalled that the transfer function of an Exclusive-OR gate is to produce a 1 at output as soon as its two outputs are in the presence of different states. If the states at its inputs are identical, the Exclusive-OR gate produces a 0 state. A three-input Exclusive-OR gate should be understood as being formed by a first two-input Exclusive-OR gate whose output is connected to a second Exclusive-OR gate that furthermore receives the third input applied to the three-input Exclusive-OR gate. The choice of the slots of the shift register, taken as inputs of the Exclusive-OR gates, may be in a mathematical form by means of a polynomial known as a generator polynomial.

The diagram of FIG. 3 shows the outputs A, B produced as and when the bits "in" and in–1 undergo changes within the shift register. Thus, at the outset, assuming that there is a 00 in "in" and in–1, the arrival of a 0 in in+1 will prompt a state (00) for A, B in the single branch indicated by an encircled 1. By contrast, the arrival of a 1 for in+1 prompts a state (11) in the branch indicated by an encircled 2. If the system is in the latter situation, at the next step the contents "in", in–1 are then equal to 1, 0 and no longer to 0, 0.

Starting from the latter state, it is possible either to insert a new 0 or to insert another 1 as a value of in+1. The possible states of the shift registers are indicated in the different lines referenced 0, 1, 2, or 3 according to the value in binary mode of the slots "in", in−1 of the register reached or started from. It will be noted furthermore that, in this simplified representation, the most significant bits are to the right and the least significant bits to the left.

The presentation of this lattice already shows certain prohibited transitions. Thus, with a state of symbols A, B (0, 0) being known, the injection of additional bits is used to obtain a new state of symbols that is either (0, 0) or (1, 1) but cannot be (0, 1). The detection of such a prohibited state, at such a moment of reception, would lead to the detection of the presence of an error.

The states of the shift register are called nodes. The transitions from one node to another are called branches. For example, a description has already been given of the branch surrounded by a 1 and the branch surrounded by a 2. The total figure is a lattice. It can furthermore be seen that a single set of binary information elements gives rise to a single path in the lattice. It will be said that the symbols are the encoded data elements available at the output of the Exclusive-OR gates.

Figure 4A:
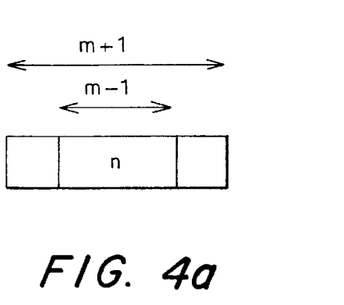
FIG. 4a illustrates the shift register comprising M+1 slots.
Figure 4B:
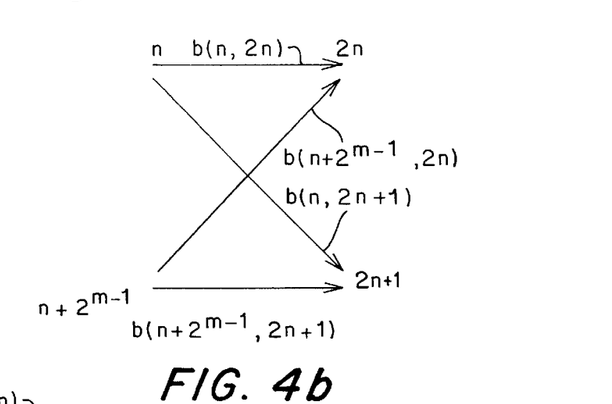
FIG. 4b illustrates what occurs when a new bit is introduced.

The general lattice image of a convolutive code having a constraint length m and a rate ½ may be summarized by FIGS. 4a to 4b. FIG. 4a shows the shift register comprising m+1 slots. In the m−1 central slots, a value n is stored to represent the value of the node. When m=2, the value of n can only be 0 or 1. The most significant bit is to the right as indicated here above. The most significant bit is the first one introduced into the register.

The meaning of FIG. 4b is that when a new bit is introduced, a node which furthermore can only have a value of n or $n+2^{m-1}$, depending on whether the bit coming out of the shift register is a 0 or a 1, can only become a node with a value 2n or a value 2n+1 respectively, with the factor reflecting the shift undergone in the register. This can easily be verified with FIG. 3 where the starting node was equal to 0. It can only become a node 2n, namely 2×0=0, or a node with a value 2n+1, namely in this case 1. If we consider the node with a value 1, its value can only get converted into 2n=2 (the branch referenced (1, 0) in FIG. 3), or a node with a value of 2n+1=3 (the branch marked (0, 1) in FIG. 3). Similarly, if the node with a value 2 is considered, this node corresponds in FIG. 4b to n=0, hence to a post-transition node equal either to 2n, hence itself also to 0, or to 2n+1, hence 1. This can be seen with the branches starting from the node 2 in FIG. 3. With regard to the node with a value 3, with n=1 according to the above considerations, it can develop only towards the node with a value 2n=2 or towards the node with a value 2n+1=3. This can also be seen in FIG. 3.

The general formula shown in FIG. 4b shall therefore be chosen for the development of the nodes as and when the bits arrive in the shift register. It will further be noted that this formula is valid irrespective of the number of stages of the shift register. Furthermore, the value defined as the value of the branch b(x,y) is defined as the value of the pair of signals A, B produced when the node goes from a value x to a value y. FIG. 4b gives a view, in a theoretical way, of the values of these branches.

Figure 4C:
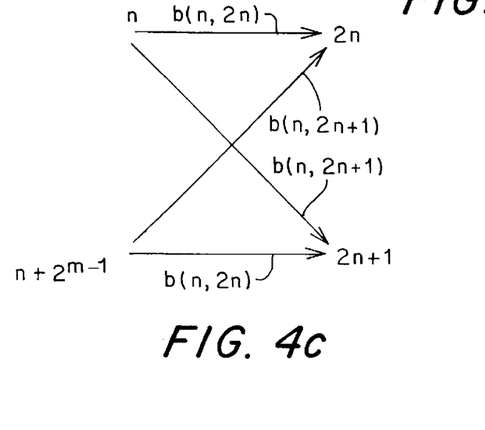
FIG. 4c illustrates the values of the signals A, B.

To simplify the decoding and hence the explanation, preferably the circuits examined in the logic computation circuits will be the circuits such that the first slot and the last slot of the shift register are each connected to two (or more) Exclusive-OR gates respectively producing the signals A, B (or more). The result of this condition is that the computations of the symbols are simplified. The branch $b(n+2^{m-1}, 2n)$ corresponds to the first slot of the shift register at 0 and to the last one equal to 1. The Exclusive-OR gate between these two bits is equal to 1. This is also the case with the branch b(n,2n+1) which corresponds to a first slot equal to 1 and to a last slot equal to 0. Similarly, the branch $b(n+2^{m-1}, 2n+1)$ shows a 1 at the first and last slots, hence the Exclusive-OR gate is equal to 0 like the branch b(n,2n). Hence, as shown in FIG. 4c, the values of the signals A, B produced can take only two values (among four) and are expressed in the form b(n,2n) and b(n,2n+1).

The aim of the decoding therefore is to reproduce the right flow of the bits A, B transmitted that have corresponded to a reference path in the lattice. It can be shown that if the transmission errors are produced, owing to the random character of the disturbing noise and because the transmitted signal is convoluted with itself in the shift register and the logic combination circuit, this coherence makes it possible to retrieve right symbols and/or the right bits that have given rise to them.

At reception, a diagram equivalent to that of FIG. 4b shows that, for a given received state, there can only be two successor states. And, continuing in this way, a successor state may itself only have two successor states. The discovery of the right routing in the lattice, which corresponds to the right bits to be transmitted, then leads to the assessment of all the possible paths in this lattice and to the choice of the most probable one that is closest to the symbols which have actually been received. If the message to be transmitted has b bits, the number of possible paths would be $2^b$ and the choice of the optimum path would require the comparison of $2^b$ paths with one another. The Viterbi algorithm enables simplifying all these computations.

Here above, it was assumed that the symbols received were binary, namely ones or zeros, whether these symbols were accurately transmitted symbols or symbols transmitted with errors. In practice, the demodulator produces analog information elements while the Viterbi decoder is a digital unit. When the analog-digital conversion occurs, rather than using a decision threshold beyond which it is assumed that a received signal is a binary 1 or a binary 0, it is possible for several bits, for example 5, to quantify the binary expression of the analog signal received and carry out a direct processing of the 5 bits (together representing a single symbol value) received to assess the best path. In this way, a software decision is made on the meaning of the symbols received. This notably improves the performance characteristics of the decoder because it is capable of making far finer choices between the paths. The drawback thereof is a slight increase in the complexity of the circuit since it is necessary in practice to process 8 bits in parallel (or 4 or 16 or another number depending on the dynamic range of analog-digital conversion chosen). Initially, it shall be assumed, to simplify the explanation, that the operation is, however, in the presence of received symbols quantified on only one bit.

For a message bit, two symbols A, B have been transmitted by the channel and therefore two symbols Sa and Sb have been received at output of the demodulator. The first operation to be performed consists in computing the probability that these symbols are attached to each of the possible branches. This probability is defined by the Hamming distance between two received symbols and the symbols expected for a given branch. This probability is called the branch metric. By convention, the more probable the branch, the smaller is the value of this metric. Its expression is thus as follows:

Formula 1

$$bm(a,b) = (Sa*a) + (Sb*b)$$

wherein a and b are the expected symbols (not those received);
Sa, Sb are the received symbols;
bm is the branch metric;
and * designates an Exclusive-OR operation.

Since a, b may each have two values, there are four possible branch metrics. The presence of Exclusive-OR gates in the expression of the metric means that this metric is all the weaker, hence corresponds to a more probable path if the signals received resemble the expected signals. Let us assume, for example, that symbols Sa=0 and Sb=1 have been received.

It is possible to write:

$$bm(0,0) = (0*0) + (1*0) = 0 + 1 = 1$$
$$bm(0,1) = (0*0) + (1*1) = 0 + 0 = 0$$
$$bm(1,0) = (0*1) + (1*0) = 1 + 1 = 2$$
$$bm(1,1) = (0*1) + (1*1) = 0 + 1 = 1$$

Naturally, the second metric bm (0,1) is the most probable one since its value is 0. However, this is not sufficient to enable the decoding because errors might have occurred and might have modified the received symbols. To avoid this and make use of the coherence of the signal as well as the absence of coherence of the noise, it is necessary to compute cumulated probabilities, namely to assess the probabilities of an entire path in the lattice.

To this end, path metrics will be computed. The principle is that, with each node, there is associated a path metric that corresponds to the probability that the node is on the right path. According to the depiction of FIG. 4c, with each node there are associated two paths, hence two branch metrics for the branches that join this node to two other nodes. For example, the node n is connected to the node 2n or the node 2n+1. The path metric chosen will be the minimum sum, by convention, of the branch metrics that mutually connected the nodes located on this path. The computation of the path metric therefore comprises firstly preliminary computations of the type:

Formula 2

$$pm(n,2n) = pm(n) + bm(n,2n)$$
$$pm(n + 2^{m-1},2n) = pm(n + 2^{m-1}) + bm(n + 2^{m-1},2n)$$
$$pm(n,2n + 1) = pm(n) + bm(n,2n + 1)$$
$$pm(n + 2^{m-1},2n + 1) = pm(n + 2^{m-1}) + bm(n + 2^{m-1},2n + 1)$$

The comparisons of the first line with the second line and of the third line with the fourth line of this formula make it possible to find out which two of these four projected path metrics has a minimum value. It is thus sought to determine the lowest cost transition so as to end, starting from a given node (n or n+$2^{m-1}$), in one of two possible nodes (n or 2n+1). The values then chosen as the path metric pm(2n) and pm(2n+1) are the minimum values of each of these two projected path metrics. At each cycle therefore, a computation is made of four possible branch metric values and only two are chosen. The operation is abbreviated as ACS for addition, comparison, selection. It is the essential part of the Viterbi algorithm.

The branch metric is computed at each time according to the Formula 1 seen further above, given the value of the symbols received. The principle amounts to stating, if the operation is at a given node (0, 1, 2, 3 on FIG. 3), what is the probability of reaching a possible node coming from a given node. Since in the example there are four nodes in all, it is necessary to compute eight path metrics and choose only four at each time to lead to the determining of the node which was the starting point, given the symbols received, to reach the node considered.

Figure 5:
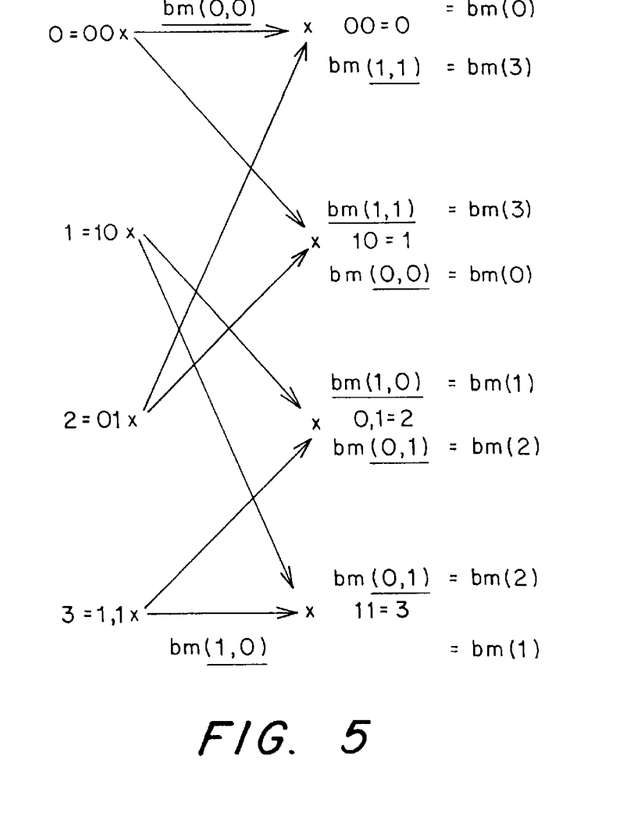
FIG. 5 illustrates eight branches enabling nodes to be bound to one another.

The computation of the branch metrics can be done beforehand, given the simplification referred to further above. It is shown in FIG. 5. Thus, starting from a node 0, 0 with a value 0, it is possible to reach only another node 0, 0 or a node 1, 0 with a value 1. If the arrival node is a node 0, 0, the symbol produced by the circuit of FIG. 2 is 0, 0. The branch referenced bm(0,0) may also be referenced bm(0) in choosing a notation from 0 to 3. By contrast, if the arrival node is the node 1, 0, the symbols produced by the circuit of FIG. 2 are 1, 1 to affirm the transition. In this case, the branch would have been the one corresponding to 11, namely 3.

Since there are only two symbols A and B which, together, can only take four values 0, 1, 2, 3, there are only four possible types of branches bm(0), bm(1), bm(2) and bm(3). According to what has been stated further above, there are four possible metric values 0, 1, 1, 2. Whenever a pair of symbols AB is received, each of these branches takes one of these four values. There are therefore in principle four branch metrics to be computed at each time.

FIG. 5, however, shows eight branches enabling the nodes to be bound to one another. It is observed however that these branches are identical in sets of two. This justifies the drawing of FIG. 4c.

Consequently, for each pair AB received, there are eight branches to be computed which are equal to one another in sets of two. It is possible to make a prior computation of the branch metrics bm(0), bm(1), bm(2), bm(3). It is possible to precompute them for the four possible values of the pair of the symbols received Sa, Sb. These computations can be done in the form of an addressing of a table, the address of which has four moments respectively representing the node considered, for example (n), the node likely to be arrived at (2n) and the values Sa and Sb of the symbols received. If Sa and Sb are each given on more than 1 bit, for example, quantified on 5 bits, the table has greater effect but the approach remains the same.

In practice, in order that the accumulation operation may occur, it is appropriate that the path metrics at the outset should all be initialized at 0.

After a number of iterations, it is possible to decode, i.e. to recover, on an a posteriori basis, the true value of the bit transmitted given the symbols received. To carry out this decoding, in practice the starting point of the decoding is the node for which the path metric is the lowest among the four last calculated values.

Figure 6:
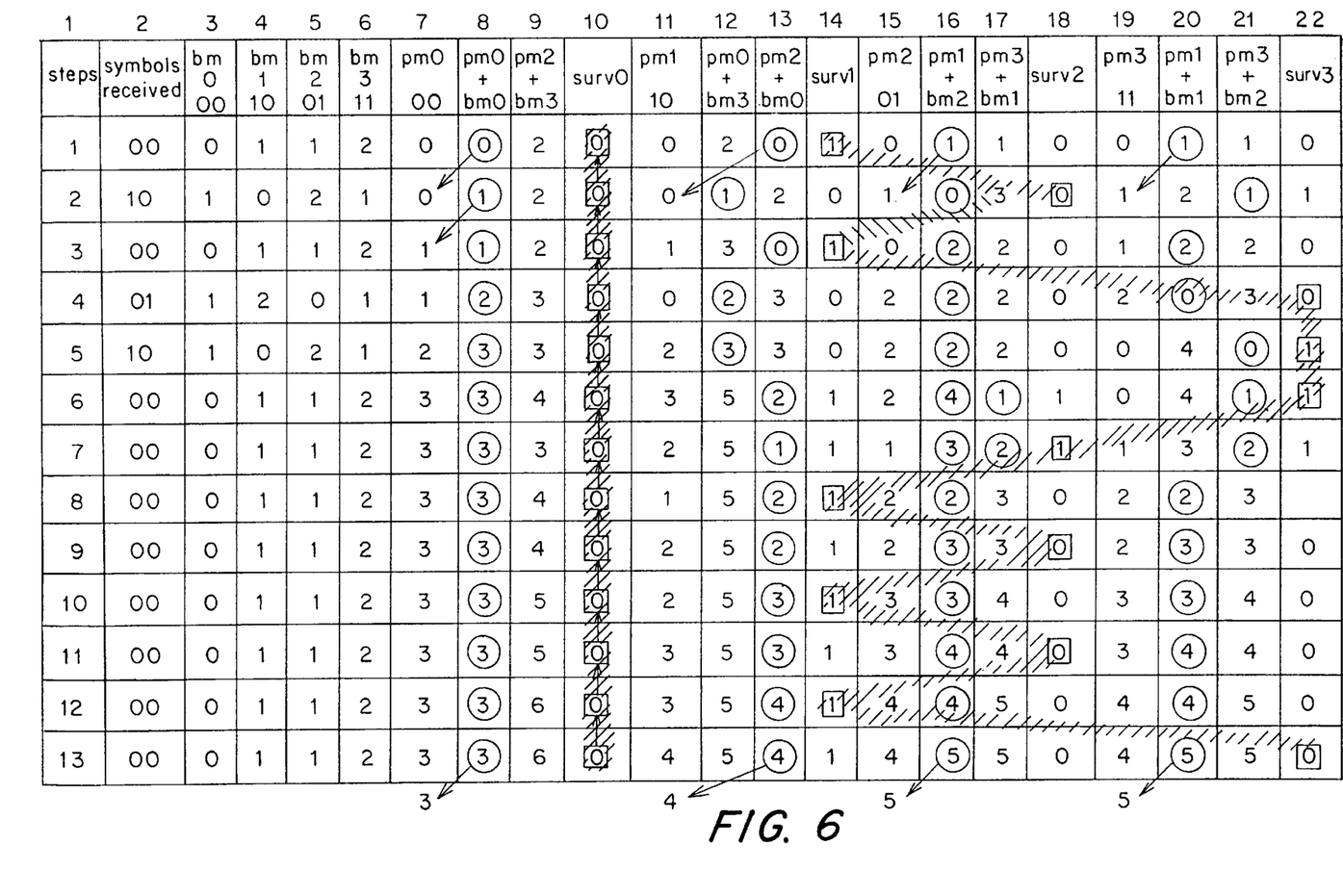
FIG. 6 is a table containing detailed results of a computation.

The table of FIG. 6 gives a detailed view of a reality of a computation made. This table shows thirteen temporal steps in column 1, the thirteenth occurring after the first one. In a second column there is shown, as an example, pairs of symbols received. It is assumed, for example, that the bits of the message were all 0s but that the pairs AB, which should all have been 0, 0, notably in the steps 2, 4 and 5 were different from 00. In the third to sixth columns, the values of the metrics of the different branches relating to the received symbols have been indicated. In each line, for these four columns, four values have been indicated. These four values depend on the value of the symbols actually received. Thus, for the branch 0, which corresponds to expected symbols of 0, 0, the branch metric is 0. For the branch 1, which corresponds to expected symbols of 1, 0 (most significant bit to the right), the branch metric equals 1. And so on and so forth for the branch metric 2 and the branch metric 3. The columns 7, 11, 15 and 19 make it possible to indicate the path metrics. It is observed that, in the step 1, all these path metrics are at 0.

The columns 8 and 9, 12 and 13, 16 and 17, and 20 and 21 are used to present the collections of the path metrics that lead to the concerned node. The graph of FIG. 5 shows that, for each pair of signals Sa, Sb received, a node may get converted into two other nodes attached to two branch metrics. For example, the nodes 0, 0 may come from the node 0, 0 with the branch metric 0, 0, or from the node 0, 1 with the branch metric 1, 1. If it comes from the node 0, its path metric will be pm0 (old value) plus bm0, metric of the branch 0. If it comes from the node 2, its path metric will be pm2 (old value) plus bm3. There will therefore be grounds for assessing the probability of coming from only one of these two nodes, preferably, by computing the lowest of the path metric 0 added to the branch metric 0, or from the path metric 2 added to the branch metric 3.

Similarly, the node 1, 1, 0 may come from the node 0, 0 by means of the branch metric 3 or from the node 2 by the branch metric 0. The node 2, 0, 1, may come from the node 1 by the branch metric 1 or from the node 3 by the branch metric 2. Finally, the node 3 may come from the node 1 by the branch metric 2 or remain a node 3 by the branch metric 1.

At a first step, branch metrics are computed in the different cases. Then, at each time, the branch chosen as the most probable branch is the one having the lowest value (the one whose metric is surrounded by a circle). When two values are identical, the first value is taken as the default value. This is the value located to the left in the columns 16 and 20 for example. Consequently, in the next step, which is the step 2, the path metric of 0 equals 0, that of 2 equals 0, that of 1 equals 1, and that of 3 also equals 1.

In view of the symbols received in the second step, in this case 10, the branch metrics bm of 0, 1, 2 or 3 are recomputed. With the new values of the path metrics which were computed at the end of the step 1 being known, it is possible to compute the projected path metrics. For example, taking column 9, the path metric 2 being equal to 1 and the branch metric 3 being also equal to 1, the projected path metric is equal to 2. Taking also column 17, the path metric 3 being equal to 1 and the branch metric 2 being equal to 2, the projected path metric is equal to 3. And so on and so forth: the eight projected path metrics are computed and a deduction is made therefrom, in each case, of the four path metrics chosen for which the value of probability is the lowest at each time. Continuing in this way, for the symbols received from the step 1 to the step 13, it is possible to compute the path metrics of the different nodes.

When a path metric among two projected path metrics is chosen, this implies the designation of a single bit that will enter the circuit of FIG. 2 to prompt the preparation of the symbols sent and received. This bit is called the survivor bit. For the different paths, it is respectively present in the columns 10, 14, 18 and 22.

In the example shown, where the bits sent were a succession of thirteen 0s, the survivor corresponding to a 0 path metric will normally be thirteen times 0. By contrast, columns 11 to 14, line 1, in view of the fact that there is a passage from the path metric of the node 2 to the path metric of the node 1 (the node 1 would be the most probable one), there has clearly been a passage from a node equal to 0, 1 to a node equal to 1, 0. This therefore means that a 1 has been entered in the shift register (FIG. 5). It is therefore appropriate to choose a 1 as survivor No. 2. Continuing in this way, the table of FIG. 6 is thus designed so that whenever one of the columns 8, 12, 16 or 20 is chosen as delivering the probable path metric, the survivor will be a survivor 0. If not, when it is the columns 9, 13, 17 or 21 that are concerned, it will be equal to 1.

The task performed is therefore twofold. At each step, it consists on the one hand in computing the eight projected path metrics and choosing only four of them. On the other hand, it consists in deducing four survivors from the four metrics chosen. In view of the sequence of symbols received as shown in FIG. 2, the table of FIG. 6 is deduced naturally.

A survivor represents the link between a current node and its predecessor. By definition, the nodes represent the contents of the shift register.

Figure 7:
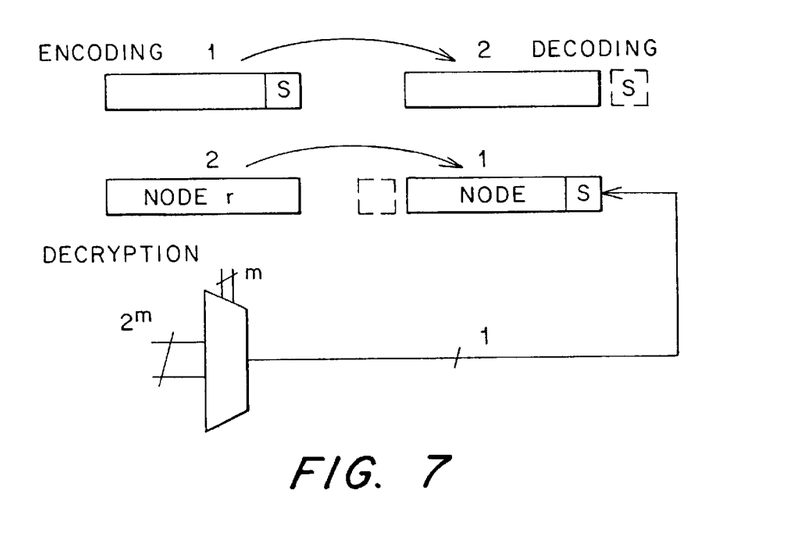
FIG. 7 is a block diagram illustrating encoding for transmission and decoding at reception.

The tracking or reconstruction of the received bits is done as follows. FIG. 7 shows firstly what happens during the pre-transmission encoding in the channel and secondly what happens at reception. At transmission, the last bit of the word is expelled from the shift register at the time of a shift. At reception, to carry out a tracking operation, in view of the knowledge of a node R, it will be possible by reverse shifting, in adding the survivor, to retrieve the node r−1 that includes this survivor. Continuing in this way, it is possible to make a trace-back from one node to another up to an old node. This circuit shown is schematic. It makes it possible, with the $2^m$ (herein m=2) path metrics and the $2^m$ survivors computed at a given step being known, to compute and find out which was the true survivor at the previous step.

The operation of the circuit of FIG. 7 can be read in FIG. 6. Normally, the node chosen as the starting node for the tracking operation is the node which on the whole has the lowest path metric. Herein, it is the node 00. At the step 13, the fact of having a survivor 0 available means that the node preceding this node 00 is a node in which the second 0 (to the right) is associated with the survivor that is itself 0. This gives a node that is 00 too. Continuing in this way, it is possible to make a trace-back to the survivors surrounded by small squares which are all 0s in column 10.

However, it is not necessary, although it is useful, to start from the most probable node. For example, it is possible to start from the node 3, equal to 11, present in column 19 line 13 for which the survivor found is equal to 0. This means that the previous node would be formed by 1, 0. In the step 12, it will therefore be necessary to start from a node 1, 0 that is given in column 11. For the column 11, the computed survivor present in the column 14 is equal to 1. Hence, at the previous stroke, the 1 departs. There remains the 0, and a 1 arrives. A node 0, 1 is obtained: column 15 for which the survivor, column 18, is itself equal to 0. Continuing in this way, a trace-back is made along the path. The survivors are surrounded by small squares.

It is noted that towards the steps 3, 2 and 1 the survivor found is not always the true expected survivor. However, if a departure of the survivor from column 18 or of the survivor from column 14 is made, it would be realized that, from the steps 5 to the steps 1, the number of erratic reconstruction paths would be limited. There would be only one off the right path and not three. It will be noted furthermore that it is precisely during the steps 2, 4 and 5 that the transmission noises occur since the symbols received are not 0, 0 at these steps. By contrast, if the memorizing of the steps had been equal to more than 13 and had led notably to a period where the signal was not excessively noisy (without three poor samples out of four samples received), it would be realized that all the paths would converge towards the transmitted value.

This is an inherent quality of the convolutive code used for the encoding. This furthermore shows the value of choosing a right initial survivor and a right initial node. If the right node is not chosen, it will be necessary to carry out memorizing operations for a longer period of time to recover the coherence of the transmitted signal. In practice, the convergence time of the nodes is limited. Irrespective of the starting point, in the present case, it can be assumed that beyond 15 nodes the result of the tracking of the bits will be accurate. The term "truncation length" refers to the number of bits that must be used in memorization to find, at each time, the right path. In one example, the truncation length is about 200.

With regard to the channel equalization, it is possible to carry out a demonstration of the same type, it being known that the coherence that is provided between the different transmitted symbols is due to the parasitic reflections undergone by the signal. These reflections are quite likely to produce echoes in the same way from one step to the other. Everything happens in practice as if what was being dealt with, in the same way, was a convolution whose initial polynomials, however, were not known. For this reason, the channel equalization may be done by implementing the Viterbi algorithm.

Figure 8:
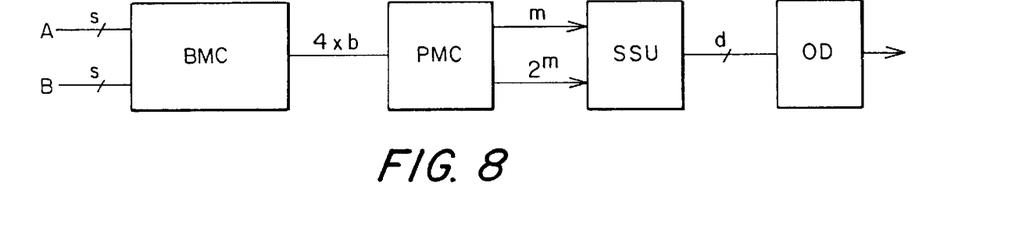
FIG. 8 illustrates the architecture of a Viterbi decoder.

The architecture of a Viterbi decoder is shown in FIG. 8. It has a first block BMC which receives the symbols AB, each quantified on s bits. This block carries out, in practice, the computations pertaining to the columns 3 to 6 of FIG. 6 in which each column is actually quantified on s+1 bits since the signals Sa and Sb are analog signals at the outset.

The next block PMC computes the path metrics and makes a choice, from among the computed path metrics, of those that are most probable according to what has been indicated here above. In practice, it computes $2^m$ path metrics and introduces $2^m$ survivors. It may be recalled that if the shift register has three slots m=2, there are four possible values of nodes. By contrast, if m equals four, in the most common case there are sixteen path metrics to be computed and sixteen survivors to be produced at each time.

Furthermore, as explained here above with reference to the decryption of FIG. 6, it is preferable to start from the most probable node, the node 0, 0 of column 7, to achieve a swifter convergence towards the right result. The block PMC therefore produces three different types of signals: the $2^m$ path metrics and the $2^m$ associated survivors as well as the designation of the initial node.

A following block SSU records the survivors and carries out the updating to compute the decoded bits. The block SSU essentially implements the circuit shown in FIG. 7. However it does so only for the survivors that correspond to the lowest path metric. Hence, the circuit SSU stores data elements equivalent to the table of FIG. 6 and performs the work of the circuit of FIG. 7.

A final block OD reshapes the processed bits. The way in which this is done shall be seen further below.

Figure 9:
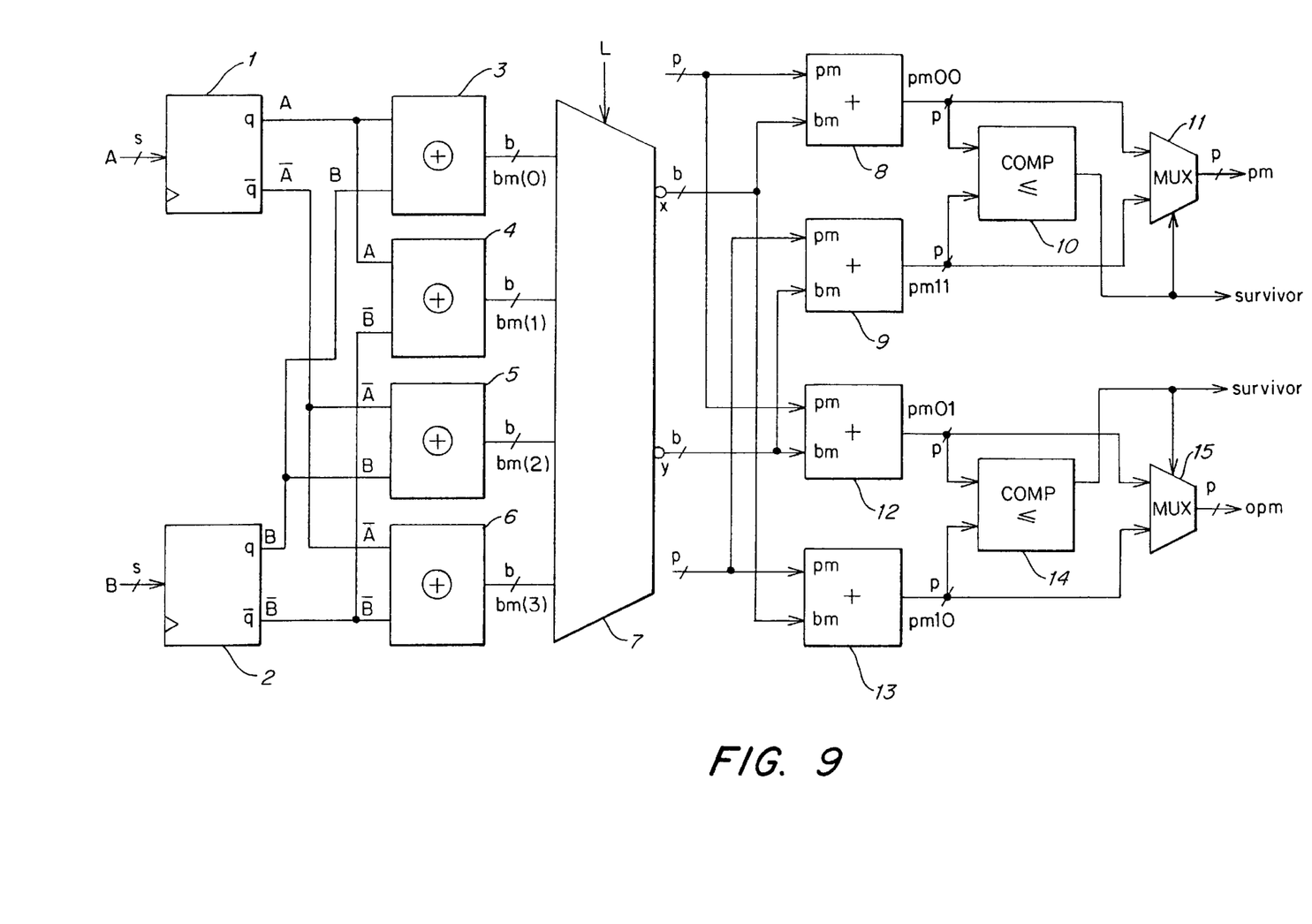
FIG. 9 illustrates one implementation of the BMC and PMC blocks illustrated in FIG. 8.

FIG. 9 gives a schematic view of a means according to the invention of the making of the blocks BMC and PMC. The left-hand part of FIG. 9 shows the production of the branch metrics. The two digital signals A B are introduced into D type flip-flop circuits, 1 and 2 respectively. Each of these flip-flop circuits which produces signals A $\overline{A}$ and B $\overline{B}$ respectively at its respective output q $\overline{q}$. In a first adder 3, the signals A and B are added so as to produce the branch metric 0. Indeed, by application of the Formula 1 seen here above, if the expected symbols a and b are equal to 0, 0 (bm(0)), the above formula gives Sa+Sb since each of these signals must be formed in an Exclusive-OR circuit, the other input of which is 0, i.e. the output of which is identical to the input signal. A similar type of explanation can explain the fact that the adders 4, 5 and 6, which receive the signals A $\overline{B}$, $\overline{A}$ B, $\overline{A}$ $\overline{B}$, respectively, produce signals bm(1), bm(2), bm(3). While, for the quantification, the signals A and B are encoded on s bits, the signals available at output of the adders 3 to 6 are encoded on s+1 bits owing to the addition. The adders 3 to 6 are s bit adders.

The branch metrics thus computed are then introduced, according to the invention, into a multiplexer 7 whose working shall be described further below. The right-hand part of the multiplexer 7 of the circuit of FIG. 9 is used to perform the functions of the block PMC. In the example shown, this circuit PMC has two pairs of adder. A first pair of adders comprises the adders 8 and 9. The other of adders comprises the adders 12 and 13. The adders 8 and 9 are, for example, entrusted with the task of performing the additions indicated in columns 8 and 9 and of FIG. 6, while the adders 12 and 13 will be entrusted with the task of performing the additions indicated in the columns 12 and 13 of FIG. 6. To this end, for example the adder 8 will receive a signal representing the old path metric quantified on p bits on an input pm. At its second input bm, the adders 8 will receive the branch metric quantified on b bits and coming from the multiplexer 7. The adder 8 delivers, at output, a projected metric corresponding in practice to the node 00. Under the same conditions, the adder 9 receives the old path metric 2 and the branch metric 3 delivered by the multiplexer 7. It produces a path metric that corresponds to the node 1, 0.

The two metrics produced by the adders 8 and 9 are compared in a comparator 10 which chooses the metric whose value is the lowest by convention. For example, (FIG. 6, line 1), the comparator 10 performs the work represented by the arrow which designates the chosen node. The comparator 10 in practice produces a signal on one bit equal to 0 or 1 depending on the node chosen. The signal delivered by the comparator 10 is introduced into the input of a multiplexer 11 that selects the metric corresponding to the minimum detected as the next metric. As it happens, in the present case, if the output signal from the comparator 10 is equal to 0, the path metric chosen is the metric of the node 00. If it is equal to 1, the metric of the node 10 will be chosen. The path metric chosen is recorded in the memory by means of the circuit SSU.

The advantage of this structure lies in the fact that the control signal of the multiplexer is used at the same time to define the survivor for the step considered. This survivor is also stored in the circuit SSU.

At the same time as the circuits 8 to 11 carry out the ACS type operation pertaining to the columns 7 to 10 of FIG. 6, comparable circuits 12 to 15 perform the ACS type operation for the columns 11 to 14. Indeed it has been observed (FIG. 6) that, to carry out these computations, all that is needed are two path metrics pm0, pm2 and two branch metrics bm0 and bm3. In a following step, with the multiplexer 7, the other branch metrics bm1 and bm2, at the same time as the other path metrics pm1 and pm3, will be placed at the disposal of the block PMC. Consequently, in two operations, if they are fast enough, it is possible to carry out all the work represented by a line of FIG. 6.

These two operations are controlled by a command L applied to the multiplexer 7 as well as to other elements that shall be examined further below. It is possible nevertheless to proceed in a different manner, i.e. either to have only one ACS type circuit and make it work as many times as there are nodes possible (4 nodes for m=2, 16 nodes for m=4 as in the preferred case) or, on the contrary, to increase the number of ACS type circuits.

Figure 10:
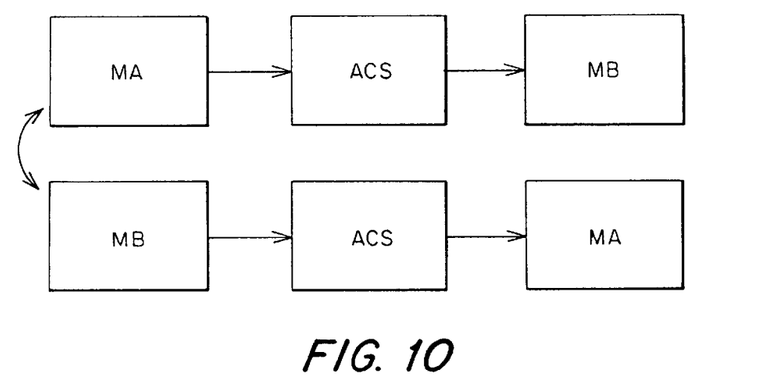
FIG. 10 illustrates the use of a circuit with two memories.

To take account of the fact that, at any time, it is necessary to know the old path metrics and the new path metrics, it is possible, according to FIG. 10, to use a circuit with two memories: a memory MA and a memory MB. In a first step, it is assumed that the old path metrics are stored in a memory MA. Its information contents are used to inject it into the general ACS type circuit that computes the new path metrics. The new path metrics are, at this particular point in time, stored in another memory MB for a following step. For a following line of the diagram of FIG. 6, the roles of these memories are quite simply reversed. The memory MB becomes a supplier or of information elements for the old path metrics. The memory MA is then used to record the new path metrics.

Figure 11:
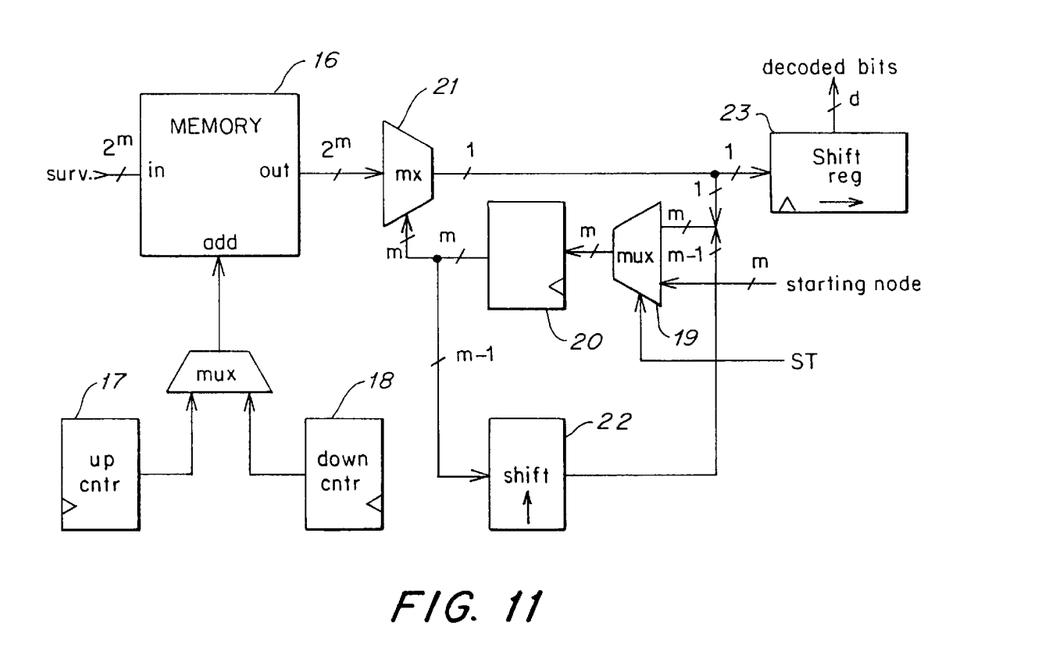
FIG. 11 illustrates one implementation on the SSU block illustrated in FIG. 8.

The schematic drawing of the circuit SSU is shown in FIG. 11. Except when the bit rate of information elements is high, this block is based on a memory: the memory 16. This memory is managed as a circular memory. The tracking procedure is performed every d cycles. In this way, at every d cycles, d bits are decoded. Thus, during d cycles corresponding in practice to d lines in FIG. 6, it is necessary to carry out d writing operations to store the survivors coming from the ACS circuits. Similarly, for the total duration of these d cycles, it is necessary to carry out the reading of Lt+d survivors, for example according to one of the routes shaded in FIG. 6. This therefore leads to the carrying out of LT+d memory reading cycles. LT is a whole number that corresponds to the truncation length: it is in short the number of survivors, since the last extracted survivor, that must be set aside before assuming that the algorithm is convergent and that the preceding bits correspond to the true bits sent.

To simplify matters, assuming that the truncation length in FIG. 6 is eight, the only values that could be considered as being valid in this figure are 13–8=5 first bits.

In view of the fact that, beyond the truncation length, all the bits are supposed to correspond to the true bits sent, the greater the memory, the greater is the number of right bits to be extracted. However, for reasons of bit rate, it is not possible either to wait indefinitely before starting the decoding operation. There is therefore a compromise to be made. The example dealt with up till now gives an approximate idea of the proportions that must be accepted.

The rotating memory 16 of FIG. 10 is therefore addressed in writing mode, at each cycle period, at an address produced by an up counter 17 synchronized with the clock of the steps. By contrast, the reading has to be performed in the decreasing sense (from the line 13 to the line 1) with a down counter 18 whose starting point is fixed, every d cycles, by the value of the counter 17. In view of the fact that, during d cycles, d metrics are written and LT+d metrics are read, the information bit rate must be low as compared with the speed of the memory so as to achieve this.

The circuit of FIG. 11 has a multiplexer 19 that is triggered by a pulse signal ST relating to the start of a tracking operation (produced every d cycles). This multiplexer 19 permanently receives the starting node, namely the one that corresponds to the smallest path metric. For example (FIG. 16 line 13), the smallest path metric is equal to 3. It corresponds to a starting node 00. This starting node, encoded on m bits, is transmitted at the start of the tracking operation by means of a register 20 to a multiplexer 21 connected to the output of the memory 16. The multiplexer 21 receives, for each step (for example the step 13), the four extracted survivors. In view of the multiplexing command applied to it, which is equal to the starting node, it selects one of the four survivors. This survivor is encoded on 1 bit. This selected survivor is stored in a register 23.

The operation referred to here above (FIG. 7), to ultimately determine the original node of the starting node, includes placing the starting node, available at output of the register 20, in a shift register 22, losing the first bit of this register and replacing it at the end by the survivor available at the output of the multiplexer 21. This new node is then transmitted to the multiplexer 19 which lets it pass through towards the registers 20 and 22 where this new node takes the place of the starting node with which the operation had begun.

And the cycle continues, leading to the availability, little by little, of all the LT+d nodes at the output of the registers 20 and 22. At the same time, the survivors are stored in the shift register 23. The register 23 may be a register with d slots only in view of the fact that only the d oldest survivors, occurring beyond the LT survivors extracted, are useful. The decoded bits are available at the outputs of the register 22.

It will be noted however that the oldest bit, for example the one corresponding to the step 1 of FIG. 6, is in the first slot of the register, close to its input, while the most recent bit, for example that of the line 5 of FIG. 6, is in the last slot of the register 23. All that the circuit OD of FIG. 8 does is to reposition these extracted bits in order.

Figure 12:
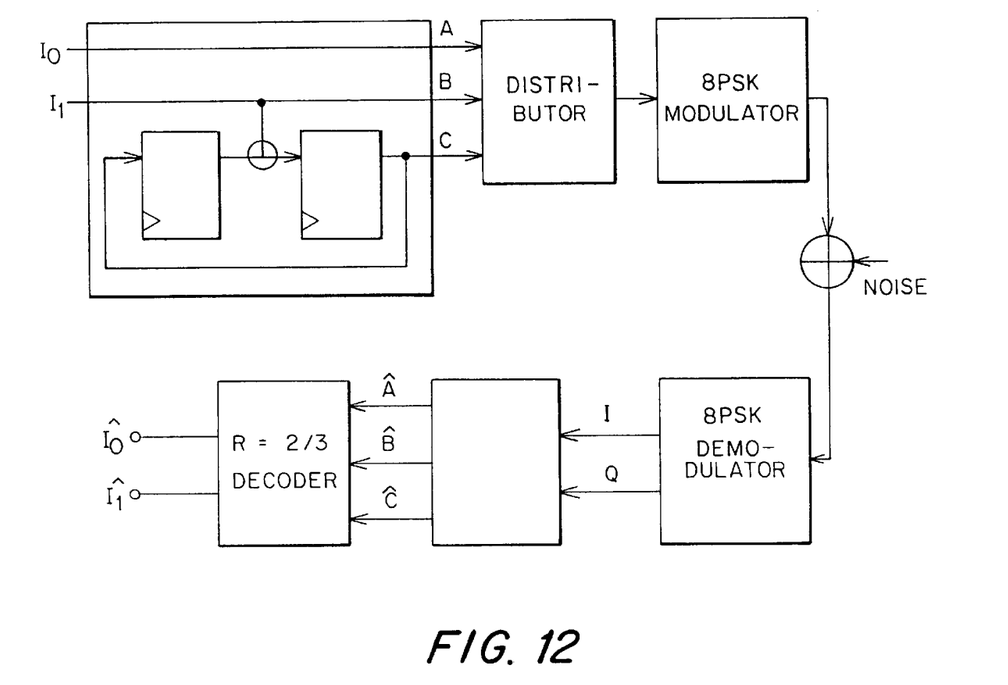
FIG. 12 illustrates a system of lattice-coded modulation.

FIG. 12 shows a system of lattice-coded modulation. It has a convolutive encoder with a rate $R=\frac{2}{3}$ since it receives two signals $I_0$ and $I_1$ and since it produces three signals A B C. This encoder is connected to an 8 PSK type modulator by means of a distributor. By means of the distributor, the three symbols A B C produce phase shifts of the carrier. The role of the distributor is to produce a correspondence between the symbols and the phase shifts which use a Gray code. Two phases that are close to each other correspond to two symbols that differ from each other by only 1 bit. Consequently, a phase error corresponds to a bit error. The demodulator produces a phase signal I and a phase quadrature signal Q. A detector connected to the demodulator estimates the three symbols received ABC which will be used in the Viterbi decoder to retrieve the two bits sent, $I_1$ and $I_0$.

In the encoding constellation proposed by the 8 PSK modulation, it is possible to distinguish two subsets of points. These subsets are chosen in such a way that the distance between the two subsets is small while the distance between the points of a subset is great. The aim of the lattice-coded modulation is to artificially increase the immunity to noise by using a convolutive code to protect the symbols produced by the distributor. The distance between two subsets is small but the bits that enable choice between these subsets are protected by a redundancy code. For example, the bits encoded B and C enable the subset to be chosen while the bit A, which is transmitted as such, enables the choice of the point in the subset. In practice, the Viterbi decoder may be capable of carrying out the detection and the decoding itself.

Figure 13:
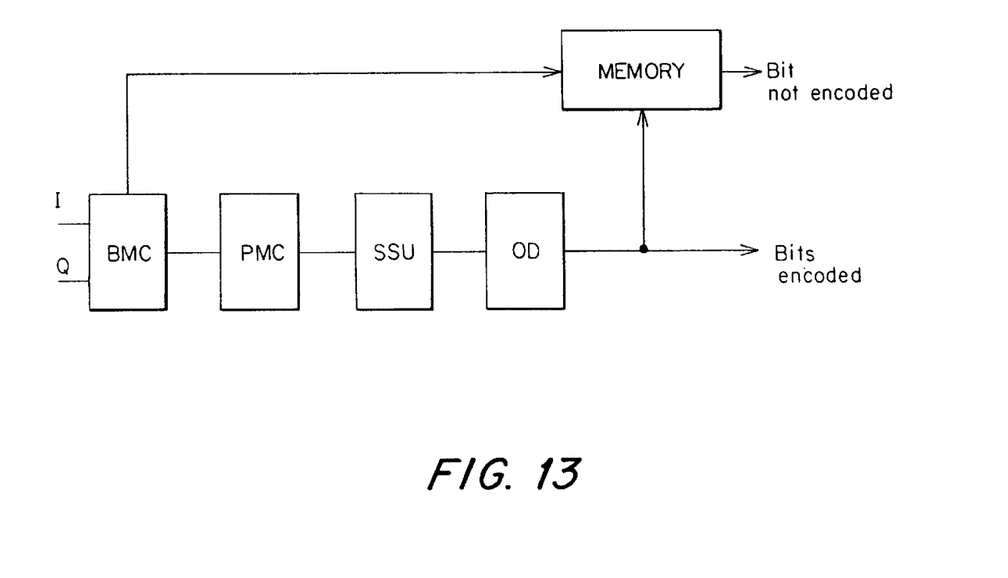
FIG. 13 is a block diagram of a decoding system.

In such a case, the branch metric computation circuit of the Viterbi decoder must produce the branch metrics by computing the Euclidean distance between the data received and all the possible points in all the subsets of constellations. To this end, the circuit retains in memory, without processing, the closest point (which corresponds to the non-encoded bits) for each subset. The choice of the subset (determined by the encoded bits) is performed by the standard Viterbi algorithm. Once the subset has been chosen and once the encoded bits have been recovered, it is possible to recover the non-coded bits. The equivalent diagram of this decoding is shown in FIG. 13.

In view of the fact that the computation of the branch metric is not done by operations of simple addition as seen here above but that a Euclidean distance is measured, the computations are preferably tabulated and access to the computed value will be made by the addressing of a table. Furthermore, in the present case, a memory is used to keep track of the non-encoded bit. This non-encoded bit is chosen as a function of the value of the encoded bits received. The memory therefore receives the non-encoded bits, non-processed from the BMC circuit, and it stores only the one that corresponds to the encoded bits.

For the equalization, it is also possible to show a use of the Viterbi algorithm. The main difference between this use and that corresponding to the convolutive encoding lies in the fact that the equivalent generator polynomials herein have real values depending on the pulse response of the transmission channel.

As is usual in this case, the Viterbi algorithm is used for the assessment, at each node, of the one that gives the minimum totalized Euclidean distance between the node expected and a node that is tested for the data elements that are actually received. This node is then used to carry out the tracking of the transmitted sequence. After numerous simplifications it may be said that, in such a case, the branch metric is of the alpha+beta $y_k$ type. In this expression, alpha and beta may be computed before the reception of the samples $y_k$.

The invention has brought out the fact that the implementation of the Viterbi algorithm in the three examples shown is identical. The only difference results from the way in which the branch metrics are computed. If the computation is tabulated, the sole difference is based on the contents of the tables. In some prior systems, all the decoding operations that have been described up till now are performed in software form by means of a processor implementing a Viterbi algorithm: at each computation step, the processor loads an instruction code, processes the data element, and carries out the transfer. A first problem arises for the performance of all these iterations in real time when the information bit rate is high. Thus, with a standard type of signal processor such as the ST 18950 by SGS Thomson Microelectronics, it has been estimated that the number of working cycles needed for the processing of a convolutive decoding sample is 208. This number of cycles is 179 when the operation is an equalization operation. The number of cycles needed for the processing of the equalizing and the decoding is therefore excessively high.

Furthermore, even if it is sought to make a specific ultra-fast integrated circuit to perform these operations in real time, there will be an additional difficulty related to the diversity of the possible encoding modes, some examples of which have been given up till now. Indeed, if we define the architecture of a ultra-fast processor, hence one that requires a great deal of effort in order to be devised and developed, then the circuit made will serve only in very few cases. It would be impossible to achieve the requisite level of profitability.

In the invention, it has been observed that the most crucial part of the processing relates to the ACS type operations. With regard to the branch metric computations, it has been seen that it is possible to gain access thereto by table reading operations. In one embodiment of the invention, a specialized circuit is provided at the periphery of a standard type of processor. This processor may be called a coprocessor and fulfills the ACS function presented hitherto. It will be noted in this regard that, in particular in the diagram shown in FIG. 9, the part to the right of the multiplexer 7, is not known in the prior art. It has been presented here only to enable an easy explanation of the invention. In practice, all that is known is the function that may be performed by the right-hand part of FIG. 9. Implementation in the form of a circuit and the concept of providing such a circuit at the periphery of an integrated circuit of a given processor is part of the invention. This means that one and the same integrated circuit will comprise the processor (which is known) and the coprocessor of the invention.

Furthermore, one characteristic of the circuit of the invention relates to addressing. This addressing is an arrangement of the memory, the pointers and the indicators that is optimal. Similarly, it enables a sequencing of the processing in a minimum number of cycles. The added structure is itself a minimum structure and, in one improvement, the way in which the operations of the coprocessor are encoded with the minimum of bits shall be seen. In one improvement, the processor used has two buses X and Y each associated with a memory. It is then possible to carry out two access operations per cycle.

Internally in the coprocessor, it is necessary, for the equalization, to be able to carry out the reading of two metrics and two probabilities as well as the computation and writing of two metrics. For the decoding, it is necessary to carry out the reading of two metrics and the writing of two metrics. In this case, the minimum number of cycles is three for the equalization and two for the decoding. The most restrictive case is therefore the case of equalization.

In the invention, an integrated circuit is provided. This integrated circuit comprises a processor and a coprocessor. The coprocessor is specialized to carry out the functions of accumulation, comparison and selection in order to limit or reduce the work of a processor which would have to perform these functions. It will be shown by making a careful choice of the structure of the coprocessor, it is possible to make this coprocessor sufficiently programmable so that it is suited to many situations of implementation of the Viterbi algorithm.

Figure 14:
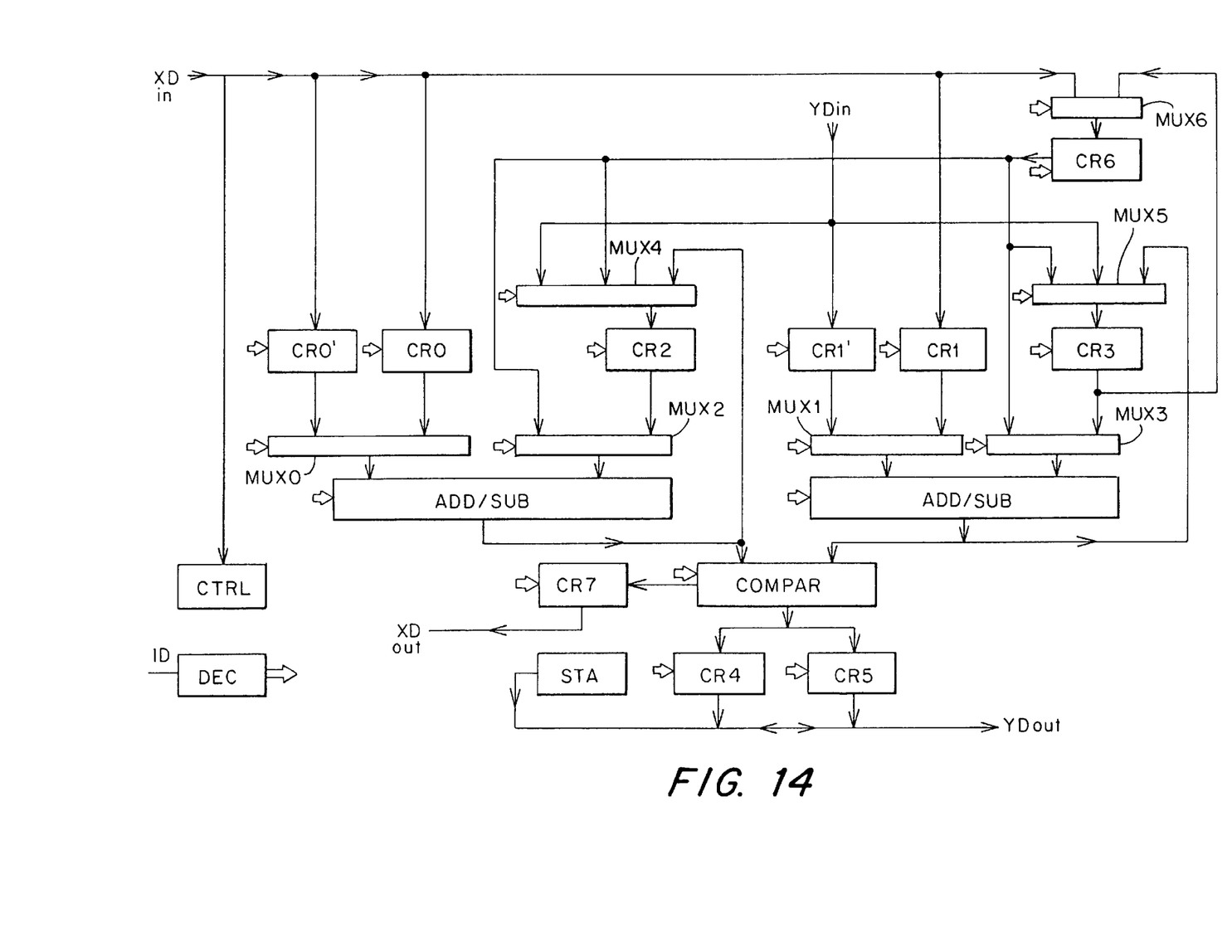
FIG. 14 shows a preferred architecture of an embodiment of the coprocessor of the invention in the case of the decoder and an equalizer.

FIG. 14 shows the architecture of the coprocessor. The processor made on the same integrated circuit is not shown. This processor manages the access to the coprocessor and the control signals for this coprocessor in a standard way. This coprocessor has two data buses XD and YD. These buses are connected firstly to the memories MA and MB seen here above and managed by the processor. The memories MA and MB may also be assembled in a single memory having dual access. These buses are switched over, from one processing operation to another, respectively from the memory MA to the memory MB and from the memory MB to the memory MA and then conversely. For a given processing operation, it will be assumed that the bus XD is connected to the memory MA which, at the time of processing, contains the old metrics. The bus XD is connected to two buffer registers CR0 and CR1, which are used to tap the old metrics read in the memory MA at the bus XD and present them to inputs of two adders/subtracters ADD/SUB. These adders/subtracters correspond to the adders 8 and 9 of FIG. 9. It has been shown furthermore that an ACS type dual circuit, as shown in FIG. 9 with the adders 8, 9, 12 and 13, is not in practice faster than a single circuit (since it is the operations of access by the buses that limit the performance of the coprocessor) but that it is, on the contrary, far more complicated. The output of the circuits of FIG. 14 is connected to the bus YD which, for the processing in progress, is connected to the memory MB.

The samples received are, after computation of the branch metrics, stored as and when they are received in either of the memories MA or MB. In the present processing operation, the branch metrics are stored in the memory MB and conveyed by the bus YD into the registers CR2 and CR3 connected to other inputs of the adders/subtracters ADD/

SUB. The outputs of the two adders/subtracters ADD/SUB are connected to the two inputs of a comparator COMPAR which carries out the processing of the circuit 10 of FIG. 9. The comparator COMPAR therefore has an output connected to two buffer registers CR4 and CR5 which store the values of path metrics chosen and delivers them on the bus YD.

If bm designates the values of the branch metrics, these values may be expressed (by application of the formula 1 here above), in the form:

$$bm1 = Sa + Sb$$
$$bm2 = Sa - Sb$$
$$-bm2 = -Sa + Sb$$
$$-bm1 = -Sa + Sb$$

In this expression, Sa and Sb represent the samples received. These values bm may be reduced to two values by bringing the signs into play.

The sequencing of the computations of metrics may then be generalized, in the preferred case where m=4 and where 16 metrics are to be computed, as follows:

| | |
|---|---|
| 1st iteration | $pm(0)-bm1, pm(1)+bm1 \longrightarrow pm(0)$ |
| | $pm(0)+bm1, pm(1)-bm1 \longrightarrow pm(8)$ |
| 2nd iteration | $pm(2)+bm1, pm(3)-bm1 \longrightarrow pm(1)$ |
| | $pm(2)-bm1, pm(3)+bm1 \longrightarrow pm(9)$ |
| 3rd iteration | $pm(4)-bm2, pm(5)+bm2 \longrightarrow pm(2)$ |
| | $pm(4)+bm2, pm(5)-bm2 \longrightarrow pm(10)$ |
| 4th iteration | $pm(6)+bm2, pm(7)-bm2 \longrightarrow pm(3)$ |
| | $pm(6)-bm2, pm(7)+bm2 \longrightarrow pm(11)$ |
| 5th iteration | $pm(8)-bm1, pm(9)+bm1 \longrightarrow pm(4)$ |
| | $pm(8)+bm1, pm(9)-bm1 \longrightarrow pm(12)$ |
| 6th iteration | $pm(10)+bm1, pm(11)-bm1 \longrightarrow pm(5)$ |
| | $pm(10)-bm1, pm(11)+bm1 \longrightarrow pm(13)$ |
| 7th iteration | $pm(12)-bm2, pm(13)+bm2 \longrightarrow pm(6)$ |
| | $pm(12)+bm2, pm(13)-bm2 \longrightarrow pm(14)$ |
| 8th iteration | $pm(14)+bm2, pm(15)-bm2 \longrightarrow pm(7)$ |
| | $pm(14)-bm2, pm(15)+bm2 \longrightarrow pm(15)$ |

It is observed that there are only eight iterations here (whereas there are actually 16 computations to be made) because during one and the same iteration two new metric values pm(i) and pm(i+8) are computed. The values of pm(i) and pm(1+8) are computed by solely changing over the signs of bm1 and bm2 at the input of the adders ADD/SUB. At the time of this change-over, the result is stored in a register CR4 or in another register CR5 as the case may be. Furthermore, this change-over is done only every other time in such a way as to alternate with the loading, in the registers, of the old metrics pm(i) and pm(i+1). Thus, at each computation step, either the signs of bm1 and bm2 and the connection of the registers CR4 or CR5 are changed over or other old metrics are loaded.

Furthermore, the comparator COMPAR also delivers the detected survivor at output in a register CR7 connected to the bus XD. In doing so, the circuit COMPAR of FIG. 14 plays the roles of the circuits 10 and 11 of FIG. 9.

In order to give greater flexibility to the circuit of FIG. 14 in the invention, the registers CR0 to CR3 are not connected directly to the inputs of the adders/subtracters ADD/SUB. They are connected to them by means of multiplexers, respectively MUX0 to MUX3. These four multiplexers can be used to give the adders/subtracters ADD/SUB respectively either corrections stored in the registers CR0' or CR1' coming from the buses XD or YD, respectively instead of giving them the old metrics stored in the registers CR0 or CR1 or else a sample SD stored in a register CR6 related with the bus XD (at the time of the processing) and related with these multiplexers MUX2 and MUX3, instead of giving them the branch metrics stored in the registers CR2 or CR3. The corrections in question relate to the echoes of the transmission channel and to quantification values which may be precomputed in correspondence (notably in tables) and used to determine the "true" value of the sample, given the values chosen for previous samples whose echoes disturb the meaning of the sample received. In practice, for example, the right-hand adder/subtracter will be used, in a first stage, to subtract the received sample from these echo corrections or to add the received sample to these echo corrections. The result will be stored in the register CR3 initially and then in the register CR6 and the contents of this register CR6 will then be represented by the multiplexers MUX2 or MUX3 when necessary.

To make these data transfers easily controllable by the processor which will control the coprocessor, the registers CR2, CR3 and CR6 are connected at input to the output of multiplexers, respectively MUX4, MUX5 and MUX6. The multiplexers MUX4 and MUX5 are connected at input to the bus YD, the register CR6 and respectively to the outputs of their respective adder/subtracter. The multiplexer MUX6 is connected at input to the bus XD and to the output of the register CR3.

In a usual way, the coprocessor has control registers CTRL and state registers STA respectively connected to the buses XD and YD. Furthermore, an instruction decoder DEC receives commands intended for the circuits of the coprocessor from the processor, by means of an instruction bus ID. This decoder DEC delivers, at all times, the commands useful for the activation of the registers, the multiplexers, the adders/subtracters and the comparator. It will be noted however that, owing to the alternating character of the working of these registers, multiplexers, adders/subtracters and comparator, the number of bits needed to control them all, despite the variety of situations, is limited. Seven bits are enough in practice.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A signal processing circuit comprising a processor, a data memory to store data received and data processed by the signal processing circuit, a program memory to store a plurality of instructions of a processing program, wherein a portion of said plurality of instructions implement a Viterbi algorithm, wherein said circuit comprises a coprocessor linked with the program memory to carry out a processing operation of accumulation, comparison and selection corresponding to the Viterbi algorithm, wherein the coprocessor comprises adder/subtractor type adders to limit iterative computations undertaken by the coprocessor.

2. The circuit according to claim 1, wherein the coprocessor has only one ACS type circuit to carry out two simultaneous additions, compare the results of the two simultaneous additions and select one of the two simultaneous additions.

3. A signal processing circuit comprising a processor, a data memory to store data received and data processed by the signal processing circuit, a program memory to store a plurality of instructions of a processing program, wherein a portion of said plurality of instructions implement a Viterbi algorithm, wherein said circuit comprises a coprocessor linked with the program memory to carry out a processing operation of accumulation, comparison and selection corresponding to the Viterbi algorithm, wherein the coprocessor comprises a set of registers whose inputs and outputs are connected to multiplexers to make the coprocessor carry out several simultaneous processing operations at each memory access operation.

4. A circuit according to claim 3, wherein the coprocessor has only one ACS type circuit to carry out two additions simultaneously, compare the results of the two additions and select one of the two additions.

5. The circuit according to claim 3, wherein the coprocessor comprises adder/subtractor type adders to limit iterative computations undertaken by the coprocessor.

6. A signal processing circuit comprising a processor, a data memory to store data received and data processed by the signal processing circuit, a program memory to store a plurality of instructions of a processing program, wherein a portion of said plurality of instructions implement a Viterbi algorithm, wherein said circuit comprises a coprocessor linked with the program memory to carry out a processing operation of accumulation, comparison and selection corresponding to the Viterbi algorithm, wherein the coprocessor comprises two buses so that the coprocessor can alternately be linked, in reading mode and then in writing mode, with two memories and wherein the processor has a circuit to alternate the connections of the coprocessor with each of the buses.

7. The circuit according to claim 6, wherein the coprocessor has only one ACS type circuit to carry out two simultaneous additions, compare the results of the two simultaneous additions and select one of the two simultaneous additions.

8. A circuit according to claim 6, wherein the coprocessor comprises a set of registers whose inputs and outputs are connected to multiplexers to make the coprocessor carry out several simultaneous processing operations at each memory access operation.

9. A method for decoding a received signal implementing a Viterbi algorithm, the method comprising the following steps:

a first adding step for adding a first old path metric to a first branch metric to produce a first new path metric;

a second adding step for adding a second old path metric to a second branch metric to produce a second new path metric, wherein the first adding step and the second adding step are performed simultaneously;

a first comparing step for comparing the first new path metric and the second new path metric to determine a first minimum path metric;

a selecting step for selecting one of the first and second new path metrics as the first minimum path metric wherein the first minimum path metric is determined by a comparator, the comparator producing a control signal to control a multiplexer, and wherein the first minimum path metric is selected by the multiplexer; and determining a survivor value based on the control signal of the multiplexer wherein the control signal is stored as the survivor value.

10. The method of claim 9, further comprising the following steps:

a third adding step for adding a third old path metric to a third branch metric to produce a third new path metric;

a fourth adding step for adding a fourth old path metric to a fourth branch metric to produce a fourth new path metric, wherein the third adding step and the fourth adding step are performed simultaneously and wherein the third and fourth adding steps are performed sequentially after the first and second adding steps; and a second comparing step for comparing the third new path metric and the fourth new path metric to determine a second minimum path metric, wherein the second comparing step is performed sequentially after the first comparing step.

11. The method of claim 9, further including a step of encoding the survivor value as a single bit.

12. The method of claim 11, further including a step of storing the survivor in a shift register, the shift register being capable of storing a finite number of oldest survivors.

13. A signal processing system for implementing a Viterbi algorithm, the system comprising:

processing means;

data memory to store data received and data processed by the signal processing system;

program memory to store a plurality of instructions of a processing program, wherein a portion of said plurality of instructions implement a Viterbi algorithm, and coprocessing means operable with program memory for performing a processing operation of accumulations, comparison and selection corresponding to the Viterbi algorithm, wherein coprocessing means includes:

means for performing two simultaneous additions;

means for comparing the two simultaneous additions; and means for selecting one of the two simultaneous additions.

14. The system of claim 13, wherein the coprocessing means includes two buses allowing the coprocessing means to be linked, in reading mode and then in writing mode, with two memories, and wherein the processing means includes means for alternating connections of the coprocessing means with each of the buses.

15. The system of claim 13, wherein the coprocessing means includes means for limiting iterative computations performed by the coprocessing means.

* * * * *